United States Patent [19]

Ogihara et al.

[11] Patent Number: 4,898,641

[45] Date of Patent: * Feb. 6, 1990

[54] SINGLE CRYSTAL WAFER OF LITHIUM TANTALATE

[75] Inventors: Masahiro Ogihara; Shinji Makikawa; Masaaki Iguchi, all of Gunma, Japan

[73] Assignee: Shin-Etsu Chemical Co., Ltd., Tokyo, Japan

[*] Notice: The portion of the term of this patent subsequent to Oct. 11, 2005 has been disclaimed.

[21] Appl. No.: 221,325

[22] Filed: Jul. 19, 1988

Related U.S. Application Data

[60] Continuation of Ser. No. 22,591, Mar. 4, 1987, Pat. No. 4,776,917, which is a division of Ser. No. 810,748, Dec. 19, 1985, abandoned.

[30] Foreign Application Priority Data

Dec. 24, 1984 [JP] Japan .................. 59-280820

[51] Int. Cl.$^4$ ............. C30B 29/30; C30B 33/00; H01L 41/01; H03H 9/00
[52] U.S. Cl. ................ 156/601; 310/313 R; 333/193; 73/866
[58] Field of Search ....... 423/593; 156/601, DIG. 71, 156/DIG. 87; 310/313; 333/193; 73/866

[56] References Cited

U.S. PATENT DOCUMENTS

| | | | |
|---|---|---|---|
| 3,788,890 | 1/1974 | Mader | 156/601 |
| 3,976,535 | 8/1976 | Barnes | 156/601 |
| 4,257,825 | 3/1981 | Schaumburg | 156/601 |
| 4,755,314 | 7/1988 | Sakaguichi et al. | 156/DIG. 87 |
| 4,776,917 | 10/1988 | Ogihara et al. | 156/DIG. 87 |

FOREIGN PATENT DOCUMENTS

| | | | |
|---|---|---|---|
| 2043762 | 4/1971 | Fed. Rep. of Germany | 156/DIG. 87 |
| 54-9174 | 1/1979 | Japan | 156/DIG. 71 |
| 54-97585 | 8/1979 | Japan | 156/DIG. 71 |
| 59-45999 | 3/1984 | Japan | 156/DIG. 71 |

OTHER PUBLICATIONS

Tien et al., Optical Waveguide Modes in Single Crystal-line LiNBO3LiTaO3 Solid Solution Films, Applied Phys. Ltrs, vol. 24, 10 May 74, pp 503–506.

Miyazawa Growth of LiNBO3LiTaO3 Single Crystal Films for Optical Waveguides, Applied Physc Ltrs, vol. 23, #4, Aug. 73, pp. 198–200.

Chin et al., Diffusion Kinetics & Optical Quality in LiNBO3–LiTaO3 Optical Waveguides Applied Phys Ltrs, vol. 26, #11, Jun. 75, pp. 637–639.

Smith et al., Correcation of Reduction in Optical Induced Refraction Induced Refractive Index in Homogenity with on Content in LiTaO2 & LiNBO3, J. Appl. Phys, vol. 30, #10, Sep. 61, pp. 4600–4602.

Rudd et al., Growth of Lithium Tantalate Crystals for Transmission Resonator and Ricterdeuress Bell Lab Research May, 1972, pp. 14–18.

Luiacono Optical Transmission Variance in Lithium Tantalate, Applied Optics, vol. 7, #3, Mar. 68, pp. 555–556.

Kosasaki Single Crystal Growth & Physical Propities of LiTAO3 Review of Electrochemical Communication Laboratories, vol. 20, #1, Jan.–Feb. 82, pp. 129–137.

Ballman Curie Temperature & Birefringement Variation in Ferroelectric Lithium Tantalate as a Function of Melt Stoichiometry, J. American Ceramic Soc., vol. 50, #12, Dec. 67, pp. 657–659.

Primary Examiner—Gary P. Straub
Attorney, Agent, or Firm—Hopgood, Calimafde, Kalil, Blaustein & Judlowe

[57] ABSTRACT

The single crystal wafer of lithium tantalate provided by the invention is characterized by the limited range of variation of the value of double refraction which should not exceed $\pm 6 \times 10^{-4}$ so that the value of the double refraction is given by $4.5 \times 10^{-3} \pm 6 \times 10^{-4}$. When single crystal wafers of lithium tantalate each satisfying the above requirements are used for the manufacture of SAW devices, the devices may have a very small deviation of the SAW sound velocity from the standard value and the range of variation of the SAW sound velocity within a wafer is also very small so that the SAW devices can be manufactured with greatly improved productivity and excellent quality.

1 Claim, 2 Drawing Sheets

SINGLE CRYSTAL WAFER OF LITHIUM TANTALATE

This application is a continuation of Ser. No. 022,591 filed on Mar. 4, 1987 now U.S. Pat. No. 4,776,917 which in turn is a divisional application of Ser. No. 810,748 filed on Dec. 19, 1985, now abandoned.

BACKGROUND OF THE INVENTION

The present invention relates to a single crystal wafer of lithium tantalate or, more particularly, to a single crystal wafer of lithium tantalate suitable as a base material for the preparation of SAW devices having well controlled performance and quality.

As is known, single crystals of lithium tantalate, lithium niobate, quartz and the like are useful as a ferroelectric material and piezoelectric material and, for example, so-called SAW devices are practically manufactured from these single crystal materials. Among these single crystal materials, in particular, lithium tantalate has a relatively high electromechanical coupling coefficient and small temperature dependency of various characteristic properties so that single crystals of lithium tantalate are useful as a material of VCR resonators and PIF filters of television sets as well as some devices for high-frequency communication instruments.

Single crystals of lithium tantalate are usually prepared by the Czochralski method in which the single crystal is grown on a seed crystal pulled up from the melt of an oxide mixture having a composition corresponding to $LiTaO_3$. The single crystal boule as grown is first subjected to a poling treatment to align the ferroelectric domains into a single-domain body which is then mechanically worked into a cylindrical form and sliced into wafers having a definite crystallographic orientation. The wafer is lapped and polished on the surface before it is used as a base plate of various kinds of devices.

For example, SAW devices are manufactured by cutting such a wafer polished and provided with an electrode of, mostly, aluminum on the surface into small square or rectangular chips. The number of the chips obtained by cutting a single wafer may be only one or may be plural depending on the diameter of the wafer and the dimensions of the desired devices. For example, it is not rare that 200 or more of devices can be manufactured by cutting a single wafer having a diameter of 3 inches. It is of course that the productivity of this process can be increased as the number of the devices taken from a single wafer is increased so that single crystal wafers having larger and larger diameters are desired as a trend toward 3 inches, 4 inches or larger diameters from the 2-inch wafers quite acceptable several years ago.

Such a recent trend of manufacturing a larger and larger number of devices from a single wafer of lithium tantalate single crystals is accompanied by a problem that, along with the increased requirement for uniform and well-controlled performance and quality of the SAW devices obtained from a single wafer, some of the characteristic parameters of the single crystal wafer vary considerably form portion to portion of a wafer and the variation of the values is more remarkable when the diameter of the wafer is larger. The most serious problem in this regard is the variation in the values of the optical properties or double refraction which is one of the most important characteristic parameters in the single crystal wafers of lithium tantalate for manufacturing SAW devices.

SUMMARY OF THE INVENTION

An object of the present invention is therefore to provide single crystal wafers of lithium tantalate used for the preparation of SAW devices free from the above mentioned disadvantages and problems in the prior art. The inventors have arrived at a conclusion after an extensive study on the relationship between the value of double refraction in the wafer as an optical property thereof and the sound velocity through an SAW device that such an object can be achieved when the double refraction of the wafer has a specific value with the variation reaching ±01.5 % so that the SAW devices Namely, the variation of the value of double refraction in a single wafer of lithium tantalate should be within $\pm 6 \times 10^{-4}$ since otherwise the sound velocity in the SAW devices prepared from the wafer may have a variation reaching ±1.5 % so that the SAW devices cannot have uniformly controlled quality and performance.

Thus, the single crystal wafer of lithium tantalate according to the invention completed on the base of the above discovery is a wafer of which the variation in the value of the double refraction determined at a wave length of 632.8 nm and at a temperature of 20° C. does not exceed $\pm 6 \times 10^{-4}$ or, preferably, $\pm 3 \times 10^{-4}$ and the value of the double refraction determined at the same wave length and at the same temperature as above is $4.5 \times 10^{-3} \pm 6 \times 10^{-4}$ or, preferably, $4.5 \times 10^{-3} \pm 3 \times 10^{-4}$.

DETAILED DESCRIPTION OF THE PREFERRED EMBODIMENTS

In the following, the single crystal wafer of lithium tantalate according to the invention is illustrated by way of examples and with reference to the accompanying drawing.

Figure 1:
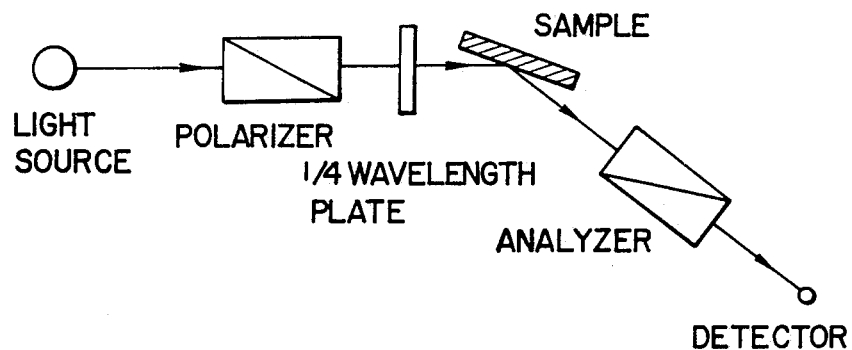
FIG. 1 is a schematic diagram of the optical system for the determination of the double refraction of a wafer.

Several single crystal wafers of lithium tantalate were prepared each having a value of the double refraction and a range of variation of the double refraction within the wafer as shown in Table 1 below. These data tabulated in Table 1 were obtained by the measurements at 20° C. using a wave length of 632.8 nm in an optical system illustrated in FIG. 1.

Figure 3:
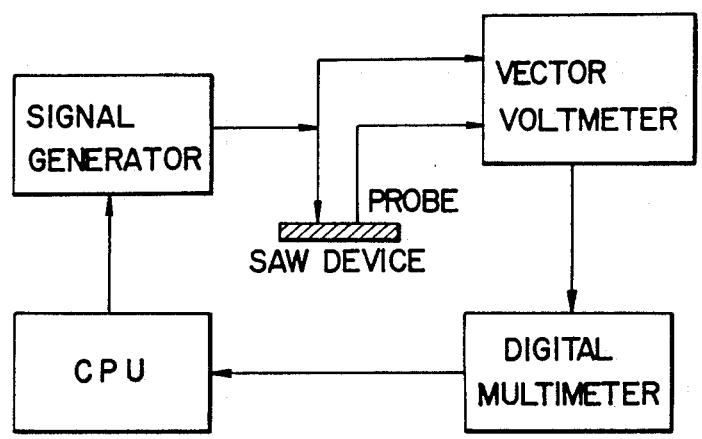
FIG. 3 is a block diagram of the electric circuit for the determination of the sound velocity of SAW in an SAW device.
Figure 2:
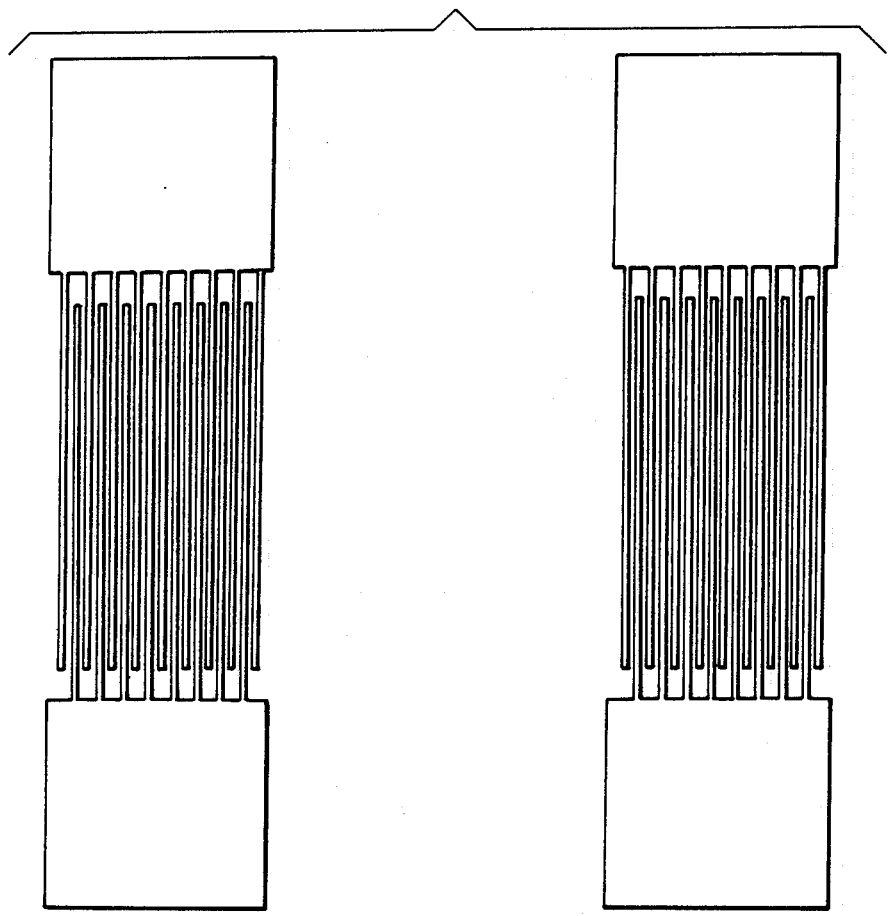
FIG. 2 illustrates a digital-formed filter prepared by patterning on a single crystal wafer of lithium tantalate in such a manner that the direction of propagation of SAW should be in parallel with the direction of 112° Y.

Each of the wafers was provided on the surface with the digital-formed filters as shown in FIG. 2 by patterning in such an orientation that the direction of propagation of SAW was in parallel with the direction of 112° Y and the sound velocity V of SAW was measured by use of the measurement system of the block diagram illustrated in FIG. 3. The phase difference between the input and output signals was determined with the frequency of the signal generator under automatic scanning and the sound velocity V was calculated from the following equation:

$$V = 2\pi L / \frac{d\phi}{dW},$$

in which V is the sound velocity, L is the distance between the digital-formed electrodes, $d\phi$ is the change in the phase and dW is the change in the frequency, V was determined as $V = L \cdot aW/20$ by means of CPU to automatically determine the frequency change W of which the value of $d\phi$ was behind by 20 times of the wave length. The frequency used for the measurement was varied in the range from 95 MHz to 105 MHz.

The results were as shown in Table 1, according to which, among the 8 experiments, quite satisfactory results were obtained in Experiments No. 2, No. 4, No. 5 and No. 6 since both of the maximum deviation of the sound velocity of SAW from the standard value and the range of variation of the sound velocity of SAW within a wafer were small. The data in Table 1 were all obtained at 20° C.

TABLE 1

| Experiment No. | Double refraction, $\times 10^{-3}$ | Range of variation of double refraction within a wafer, $\times 10^{-3}$ | Maximum deviation in percent of SAW sound velocity from standard value | Range of variation in percent of SAW sound velocity within a wafer |
|---|---|---|---|---|
| 1 | 5.2 | ± 0.6 | 0.17 | ± 0.08 |
| 2 | 5.0 | ± 0.1 | 0.08 | ± 0.01 |
| 3 | 4.8 | ± 0.8 | 0.14 | ± 0.10 |
| 4 | 4.6 | ± 0.2 | 0.04 | ± 0.02 |
| 5 | 4.4 | ± 0.5 | 0.08 | ± 0.06 |
| 6 | 4.2 | ± 0.3 | 0.08 | ± 0.04 |
| 7 | 4.0 | ± 0.7 | 0.16 | ± 0.09 |
| 8 | 3.8 | ± 0.3 | 0.13 | ± 0.04 |

What is claimed is:
1. A method of preparing an SAW device having a deviation in the sound velocity of less than ±0.15% which comprises the steps of: (a) providing the surface of a single crystal wafer of lithium tantalate having a double refraction value of $4.5 \times 10^{-3} \pm 6 \times 10^{-4}$ and in which the value of the variation of the double refraction value does not exceed $\pm 6 \times 10^{-4}$ measured at a wavelength of 632.8 nm and at a temperature of 20° C.; and (b) forming two patterned electrodes on the surface of the single crystal wafer in a parallel alignment with each other in such an orientation that the direction of propagation of SAW is in parallel.

* * * * *